(12) United States Patent
Bosman et al.

(10) Patent No.: US 7,022,588 B2
(45) Date of Patent: Apr. 4, 2006

(54) METHOD OF MANUFACTURING AN ELECTRONIC COMPONENT AND ELECTRONIC COMPONENT OBTAINED BY MEANS OF SAID METHOD

(75) Inventors: Johan Bosman, Eindhoven (NL); Peter Wilhelmus Maria Van De Water, Nijmegen (NL); Roelf Anco Jacob Groenhuis, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 20 days.

(21) Appl. No.: 10/492,334

(22) PCT Filed: Oct. 8, 2002

(86) PCT No.: PCT/IB02/04112

§ 371 (c)(1),
(2), (4) Date: Apr. 9, 2004

(87) PCT Pub. No.: WO03/031193

PCT Pub. Date: Apr. 17, 2003

(65) Prior Publication Data

US 2004/0253768 A1  Dec. 16, 2004

(30) Foreign Application Priority Data

Oct. 9, 2001  (EP)  ................................. 01203817

(51) Int. Cl.
  *H01L 21/268* (2006.01)
(52) U.S. Cl. .................. 438/462; 438/401; 438/975
(58) Field of Classification Search ............... 438/401, 438/462, 975, FOR. 435, FOR. 495
  See application file for complete search history.

(56) References Cited

U.S. PATENT DOCUMENTS

| | | | |
|---|---|---|---|
| 4,401,992 A | 8/1983 | Vorst et al. | |
| 4,743,463 A | 5/1988 | Ronn et al. | |
| 5,219,977 A * | 6/1993 | Kreuz | ........................ 528/125 |
| 5,800,724 A * | 9/1998 | Habeger et al. | ............... 216/35 |
| 5,960,712 A * | 10/1999 | Jiang et al. | .................. 101/129 |
| 6,097,830 A * | 8/2000 | Zelinka et al. | ............... 381/431 |
| 6,627,286 B1 * | 9/2003 | Lutz | .......................... 428/40.9 |
| 6,717,819 B1 * | 4/2004 | Chung | ........................ 361/760 |
| 2002/0096759 A1 * | 7/2002 | Hirano et al. | ................ 257/706 |

* cited by examiner

*Primary Examiner*—George Fourson
*Assistant Examiner*—Joannie Adelle García
(74) *Attorney, Agent, or Firm*—Peter Zawilski

(57) ABSTRACT

The invention relates to a method of manufacturing an electronic component (1), in particular a semiconductor component (1), which is provided with electric connection regions (2), wherein a mark (M), such as a type number, is provided on a surface thereof by means of laser radiation (3).

Figure 1:
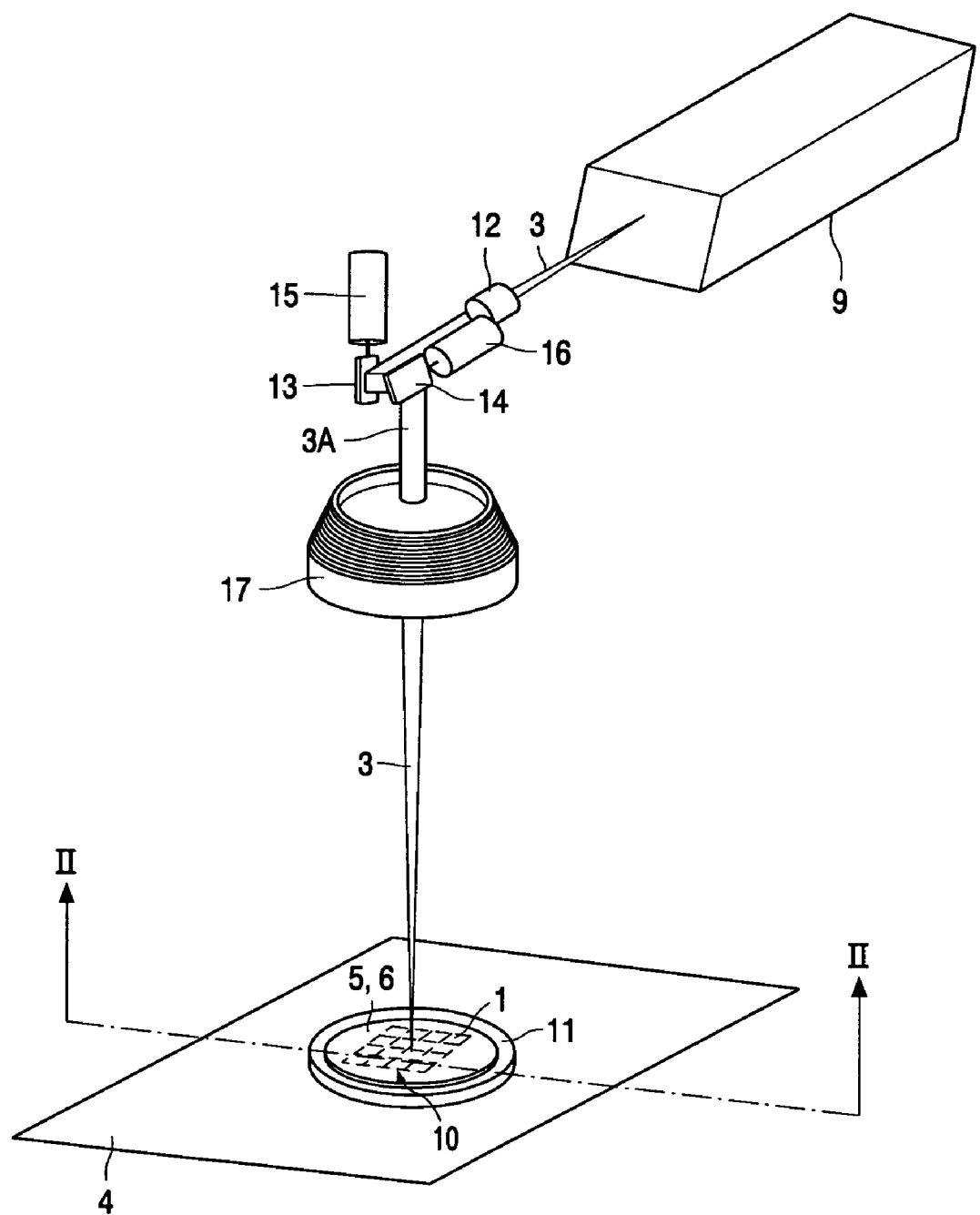

In a method according to the invention, the component (1) is attached with one (4) of its sides (4, 7) to a foil (5) by means of an adhesive layer (6), and the component is provided, on said side (4), with the mark (M) through the foil (5) and the adhesive layer (6). In this manner, a large number of components (1) can be readily provided with a mark (M) without undue handling, and the marking operation can be readily integrated in the complete manufacturing process of the components. Surprisingly it has been found that marking through a radiation-absorbing double layer (5, 6) is very well feasible. The component (1) can be attached to the foil (6) without contact between the electric connection region (2) and the adhesive layer. Preferably, a large number of components (1) are manufactured simultaneously and within a single body (10) that is attached to the foil (5). After the provision of the mark (M), the components (1) are separated from each other.

14 Claims, 2 Drawing Sheets

METHOD OF MANUFACTURING AN ELECTRONIC COMPONENT AND ELECTRONIC COMPONENT OBTAINED BY MEANS OF SAID METHOD

The invention relates to a method of manufacturing an electronic component that is provided with electric connection regions, wherein a mark is provided on a surface of the electronic component, in particular a semiconductor component, by means of laser radiation, a part of the surface of the component being exposed to the laser radiation, causing it to be modified in such a manner that the irradiated part visually contrasts with the rest of the surface and forms the mark.

Such a method is advantageously used to provide a mark containing information about the product, such as type number, serial number etc., or information about the supplier. The method is simple and inexpensive.

A method of the type mentioned in the opening paragraph is known from U.S. Pat. No. 4,401,992, published on 30 Aug. 1983. Said patent specification describes how a color contrast is created on the surface of the synthetic resin encapsulation of an electronic component by means of a laser beam. With a view to providing the mark on the encapsulation, additives that can suitably be added to the synthetic resin for this purpose are stated. Also suitable intensities and, if use is made of a pulsed laser, a suitable pulse duration are stated.

A drawback of the known method resides in that it is not readily applicable on a large scale. Manipulation of the component before and after the provision of the mark takes time and requires the use of a manipulating device. Consequently, providing a mark on a large number of components in a high-speed, low-cost operation is not easy.

Therefore, it is an object of the invention to apply a method that enables a large number of components to be rapidly and inexpensively provided with a mark.

To achieve this, a method of the type mentioned in the opening paragraph is characterized in accordance with the invention in that the electronic component is attached with one side to a foil by means of an adhesive layer, and the component is provided, on this side, with the mark through the foil and the adhesive layer. By attaching components, particularly a large number of components, to a foil, these components can be readily manipulated by manipulation of the foil. The adhesive layer enables the components to be temporarily attached, and said adhesive layer can be readily removed, for example, by means of UV radiation. At a comparatively small adhesive strength of the adhesive layer, the component can also be mechanically removed from the foil. Providing the mark through the foil and the adhesive layer has the advantage that a side opposite the side of the component to be provided with a mark does not have to come into contact with the adhesive layer. As a result, said side, which in practice often comprises the electric connection regions, is not exposed to or contaminated by impurities from the adhesive layer that may adversely affect the electric conductance of said side or the quality of an electric connection to be established with said side. Surprisingly, it has been found that a suitable choice of the laser radiation and the radiation conditions enables a good mark to be provided on the component without premature detachment of said component from the foil, in spite of the fact that a substantial part of the laser radiation is absorbed by the synthetic resins suitable for the foil and the adhesive layer. The invention is further based on the recognition that the damage to the foil and the adhesive layer caused by a method in accordance with the invention does not constitute an insuperable drawback since the component can be removed from the foil again after the mark has been provided.

In a preferred embodiment of a method in accordance with the invention, consequently, a side of the component opposite a side wherein the electric connection regions of the component are situated is chosen as the side with which the component is attached to the foil. Preferably, a (large) number of components within a body are jointly manufactured so as to be interconnected and attached to the foil, after which they are individualized following the provision of the mark. Said individualization operation comprises, for example, sawing or cutting, a foil-extension operation, if necessary, and removing the components from the foil. This can take place by picking up the component, either before or after the removal of the adhesive layer. The adhesive layer can be removed, for example, by means of an (Ultra Violet) light treatment, a heat treatment or by means of a solvent. The provision of the mark may take place before or after the sawing or cutting operations. Preferably, marking takes place after the cutting or sawing operation, so that each component can be individually characterized and tested prior to the provision of the mark. As a result, the mark may also comprise test data or characteristic data.

In a favorable modification, the component, prior to being attached to the foil, is provided with an encapsulation that is preferably made of a synthetic resin, and a surface of the encapsulation of the component is used as the part of the surface that is provided with the mark. As regards a synthetic resin encapsulation based on an epoxy, the best results are achieved using radiation from a continuous working laser. In this case, an optical pumped fiber laser can suitably be used as the laser. Said laser is compact and inexpensive, and it does not require cooling from an external source. A diode laser can advantageously be used for pumping.

If a metal is used as the material for the component or for a part of the encapsulation, then laser radiation generated by means of a pulsed laser yields the best results. Just as for marking a synthetic resin encapsulation, a wavelength of the laser radiation of approximately 1064 nm was found to be the most suitable. In both cases, the visual contrast is obtained by ablation and/or melting of a part of the surface of the component that is exposed to the radiation. In addition, this wavelength has the advantage, as compared to much shorter or much longer wavelengths, that a laser available for this purpose is most suited for industrial applications.

For the material of the foil use can advantageously be made of a material selected from the group of materials comprising polyvinyl chloride (PVC), polycarbonate (PC), polyethylene terephthalate (PET) and polyethylene naphthalate (PEN). A PET foil is particularly attractive as the strength of this foil enables the components present on the foil to be separated by means of sawing. A PVC foil has the advantage that it has a comparatively high flexibility. After the components have been separated from each other, the spacing between them can be readily increased by extending the foil. Materials that proved to be suitable for the adhesive layer form part of the group of materials comprising acrylates.

In a favorable further embodiment, the foil is provided with an ablation layer that can be removed by absorption of laser radiation, as a result of which the components (after the provision of the mark) are removed from the foil. For this purpose, use is preferably made of a layer that absorbs laser radiation of a wavelength that differs from that of the laser radiation used to provide the mark. If this ablation radiation is generated by means of the laser radiation used to provide the mark, then the marking and ablation operations can both be carried out using a single laser. The ablation radiation is generated, for example, as the third harmonic of the laser radiation that is preferably used to provide the mark, which radiation has a wavelength of 1064 nm for instance.

A method in accordance with the invention can very advantageously be applied to semiconductor components such as—in particular discrete—diodes and transistors. The method is particularly attractive for the manufacture of so-termed SMD (=Surface Mounted Device) components. The invention finally also comprises a component provided with a mark, in particular a semiconductor component, which is manufactured by means of a method in accordance with the invention.

These and other aspects of the invention are apparent from and will be elucidated with reference to the embodiment(s) described hereinafter.

Figure 2:
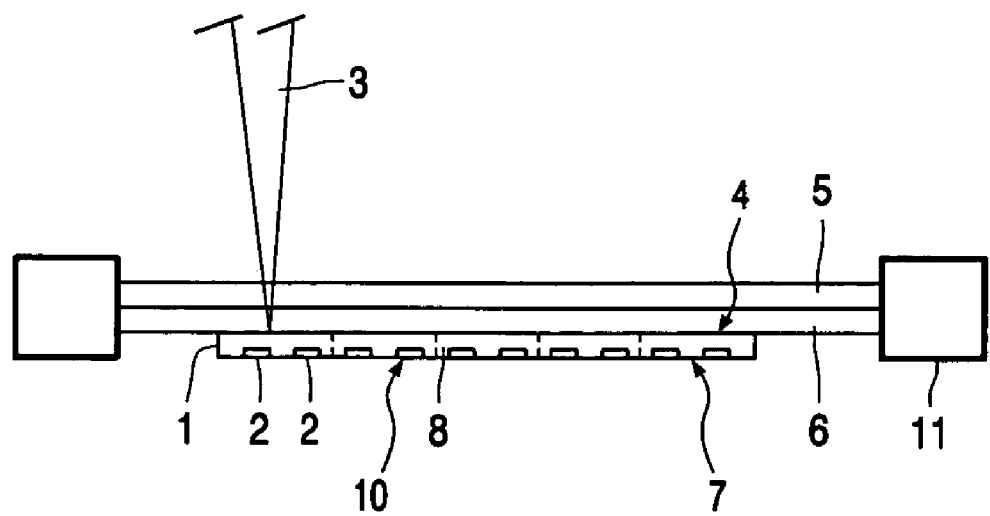
Figure 3:
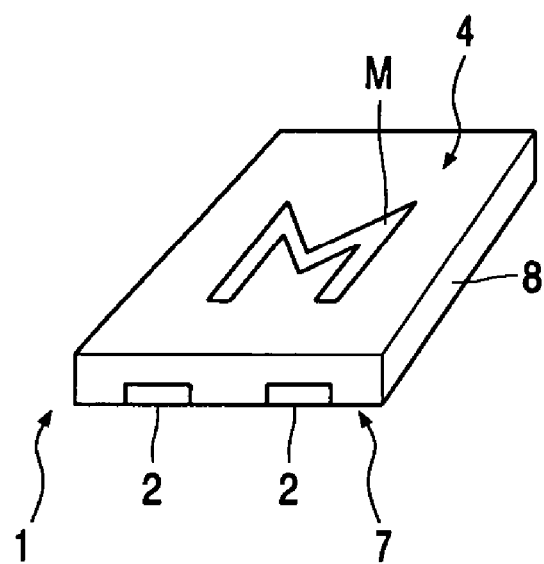

In the drawings:

FIG. 1 diagrammatically shows, in perspective and partly in a phantom view, a semiconductor device manufactured by means of a method in accordance with the invention, FIG. 2 is a cross-sectional view of the device shown in FIG. 1 in the direction II—II, and FIG. 3 is a diagrammatic, perspective view of the finished device shown in FIG. 1.

The Figures are not drawn to scale and some dimensions are exaggerated strongly for clarity. Corresponding areas or parts bear the same reference numerals whenever possible.

FIG. 1 diagrammatically shows, in perspective and partly in a phantom view, a semiconductor device that is manufactured by means of a method in accordance with the invention, and FIG. 2 shows the device of FIG. 1 in a cross-sectional view in the direction II—II. The finished device is shown in FIG. 3. The device 1 comprises (see FIG. 3) in this example a diode 1 that is suitable for surface mounting. A silicon semiconductor element, not shown, having a pn-junction is situated on a lead frame, not shown either, and is surrounded by a synthetic resin encapsulation 8, which in this case is made of an epoxy material. On a side 7 of the diode 1 there are two electric connection regions 2, and on an opposite side 4, there is a mark M. This mark comprises, for example, a type number or a serial number.

The diode 1 provided with the mark M is manufactured as follows. By means of a so-termed lead frame on which a large number of semiconductor elements are provided, a body 10 (see FIGS. 1 and 2) is formed by enveloping the lead frame with the semiconductor elements by an epoxy encapsulation 8. In this process, the connection regions 2 extending in the surface 7 are left uncovered. The body 10 is subsequently (see FIG. 2) attached to a foil 5 by means of an adhesive layer 6. In this case, the foil contains PET and has a thickness of 180 µm. The adhesive layer 6 comprises an UV-curing acrylate adhesive and has a thickness of approximately 20 µm. The body 10 comprises, in this case, 40×40 individual diodes 1 and is 4×4 cm². The foil 5 has a diameter of 8 cm and is stretched and secured within a synthetic resin ring 11. The body 10 including the diodes 1 forming part of said body is attached with a side 4 to the foil 5, said side 4 being opposite the side 7 wherein the connection regions 2 are situated. As a result, the connection regions 2 remain clean and the electrical properties, such as resistance and contactability thereof remain in tact. Suitable foils 5 are, inter alia, Adwill that is marketed by Lintec, or SWT foils marketed by Nitto. The foil described in this example is an Adwill foil bearing type designation D218.

By means of a laser beam 3, the sides 4 of the diodes 1 are subsequently provided with the mark M through the foil 5 and the adhesive layer 6. In this process, a part of the surface 4 is melted and/or removed, resulting in a visual contrast with the non-irradiated part of the surface 4. As the foil 5 and the adhesive layer 6 are absorbent, they are damaged by the laser beam 3, however, since they are used only as a temporary carrier of the components 1, this is not a drawback. Surprisingly, it has been found that a high-quality mark M can be provided in this very efficient manner on the component 1 without the components becoming prematurely detached from the foil.

The equipment used to provide the mark M (see FIG. 1) comprises the following parts: a garnet (Nd:YAG) laser 9 by means of which a radiation beam 3 having a wavelength of approximately 1064 nm is generated. The beam 3 is directed to a beam broadener 12 and broadened by means of two lenses. Subsequently, the beam 3 is converted to a scanning beam 3A by means of two mirrors 13, 14 that are coupled to electric motors 15, 16 by means of which the mirrors 13, 14 can be rotated. Subsequently, by means of a suitable lens 17, the scanning beam 3A is focused through the foil 5 and the adhesive layer 6 on the upper side 4 of the component 1 serving as the focusing plane 4. Said lens 17 comprises different optical components that make sure that the focusing plane of the lens 17 is as flat as possible.

The method in accordance with the invention can particularly suitably be used to provide a mark M on comparatively small components 1, in particular discrete semiconductor components 1 such as diodes or transistors. Although these components always have been small in relation to ICs (=Integrated Circuits), they too are manufactured so as to become smaller and smaller in size, which is partly motivated by the cost price, but more particularly by the increasing integration and compactness of the devices, such as mobile telephones, wherein the components are intended to be used.

Good results as regards the mark M are achieved, in this example, at a power P of 1.1 W and a scanning rate v of 250 mm/sec. The width of the beam 3 is approximately 40 µm in this case. All this implies that the energy flux $\Phi$ used is approximately 0.1 Joule/cm². This results in a depth of approximately 40 µm of the mark M. The best results are achieved by using a CW (=Continuous Working) laser. This implies that instead of the laser 9 used in this example, use can very satisfactorily be made of an optical pumped glass fiber laser. The glass fiber may comprise an Nd-containing fiber, and pumping may take place using a diode laser which emits at approximately 1 µm and the active layer of which comprises, for example, InGaAs.

The method in accordance with the invention can also very suitably be used to manufacture components 1 whose mark M is provided on a metal. The metal may be part of the encapsulation 8 of the component 1, but a mark can be alternatively provided on a metal that is situated directly on the semiconductor element, which is not individually shown in the drawing. In this case, the marking operation is carried out, of course, prior to the provision of the encapsulation 8. And good results are obtained at a power P of 2.5 W, a pulse energy Q of 0.5 mJoule/pulse and a scanning rate v of 400 mm/sec. The width of the beam 3 is approximately 80 µm in this case, the pulse duration t ranges from 1 to 200 nsec., in this case approximately 120 nsec., and the repetition rate f is 1 kHz to 400 kHz, in this case 3 kHz. All this implies that the energy flux $\Phi$ used is approximately 10 Joule/cm². This results in a mark M having a depth of the order of magnitude of 1 µm. It has been found that a number of pulses ranging between 1 and 5 still passes, completely or partly, through the foil 5 and the adhesive layer 6. For marking metals such as gold or copper, it has been found that a pulsed laser is the most suitable radiation source.

After the provision of the mark M, (in both cases mentioned above) the components 1 are separated from each other by means of sawing. The foil 5 used in this example is particularly suitable for such a process. After this, the components 1 can be readily removed from the foil, by use of manipulators, and packaged in a synthetic resin box-shaped body that is provided with small boxes wherein the components 1 are placed. The adhesive layer 6 can be removed in various ways. In addition, the components 1 can be packaged by means of one or more packaging foils.

The invention is not limited to a method such as described in the example since, within the scope of the invention, many variations and modifications are possible to people skilled in the art. For example, instead of irradiating the area of the symbol to be formed, the environment thereof can be irradiated so as to form a negative mark as it were It is further noted that the foil used in the manufacturing process in accordance with the invention can also be used, in said manufacturing process, as (a part of) the eventual packaging of each component.

The invention claimed is:

1. A method of manufacturing an electronic component that is provided with electric connection regions wherein a mark is provided on a surface of the electronic component by means of laser radiation, a part of the surface of the component being exposed to the laser radiation, causing it to be modified in such a manner that the irradiated visually contrasts with the rest of the surface and forms the mark, characterized in that the electronic component is attached with one side to a foil by means of an adhesive layer, and the component is provided, on this side, with the mark through the foil and the adhesive layer, wherein a number of components within a body are jointly manufactured so as to be interconnected and are attached to the foil, after which they are individualized following the provision of the mark.

2. A method as recited in claim 1, wherein a side of the component opposite a side wherein the electric connection regions are situated is chosen as the side with which the component is attached to the foil.

3. A method as recited in claim 1, wherein the component, prior to being attached to the foil, is provided with an encapsulation, and a surface of the encapsulation of the component is used as the part of the surface that is provided with the mark.

4. A method as claimed in claim 3, characterized in that for the material of the part of the encapsulation that is provided with the mark use is made of an epoxy, and the laser radiation is generated by means of a continuous working laser.

5. A method as claimed in claim 4, characterized in that the laser radiation is generated by means of a fiber laser that is optically pumped by means of a diode laser.

6. A method as claimed in claim 3, characterized in that for the material of the part of the encapsulation that is marked use is made of a metal, and the laser radiation is generated by means of a pulsed laser.

7. A method as recited in claim 1, wherein the mark is provided using laser radiation having a wavelength of approximately 1064 nm.

8. A method as recited in claim 1, wherein for the material of the foil use is made of a material that is selected from the group of materials consisting of polyvinyl chloride, polycarbonate, polyethylene terephtalate and polyethylene naphthalate.

9. A method as recited in claim 1, wherein for the material of the adhesive layer use is made of a material that is selected from the group of materials comprising acrylates.

10. A method as recited in claim 1, wherein the foil is provided with an ablation layer that can be removed by means of absorption of laser radiation, as a result of which the components are removed from the foil.

11. A method as claimed in claim 10, characterized in that the ablation layer absorbs laser radiation of a wavelength that differs from the wavelength of the laser radiation used to provide the mark which laser radiation is preferably generated by means of the laser radiation used to provide the mark.

12. A method as recited in claim 1, wherein a semiconductor component is used as the component.

13. A method as recited in claim 1, wherein a component that is suitable for surface mounting is used as the component.

14. An electronic component provided with a mark, said component is manufactured by the method as recited in claim 12.

* * * * *